(12) United States Patent
Brianceau et al.

(10) Patent No.: US 12,488,983 B2
(45) Date of Patent: Dec. 2, 2025

(54) METHOD FOR ACTIVATING AN EXPOSED LAYER

(71) Applicant: COMMISSARIAT A L'ENERGIE ATOMIQUE ET AUX ENERGIES ALTERNATIVES, Paris (FR)

(72) Inventors: Pierre Brianceau, Grenoble (FR); Nicolas Posseme, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 428 days.

(21) Appl. No.: 18/068,805

(22) Filed: Dec. 20, 2022

(65) Prior Publication Data

US 2023/0207311 A1 Jun. 29, 2023

(30) Foreign Application Priority Data

Dec. 29, 2021 (FR) .................................. 21 14604

(51) Int. Cl.
*H01L 21/02* (2006.01)
*H01L 21/762* (2006.01)

(52) U.S. Cl.
CPC .... *H01L 21/0234* (2013.01); *H01L 21/02123* (2013.01); *H01L 21/02208* (2013.01); *H01L 21/02274* (2013.01); *H01L 21/762* (2013.01)

(58) Field of Classification Search
CPC ........... H01L 21/0234; H01L 21/02123; H01L 21/02208; H01L 21/02274; H01L 21/762;
(Continued)

(56) References Cited

U.S. PATENT DOCUMENTS 10,434,749 B2 10/2019 Tong
2004/0235266 A1 11/2004 Tong
(Continued)

OTHER PUBLICATIONS

French Preliminary Search Report and Written Opinion issued Aug. 26, 2022 in French Application 21 14604, filed on Dec. 29, 2021 (with English Translation of Categories of Cited Documents), 9 pages.

(Continued)

*Primary Examiner* — Julia Slutsker
(74) *Attorney, Agent, or Firm* — Oblon, McClelland, Maier & Neustadt, L.L.P.

(57) ABSTRACT

A method for activating an exposed layer of a structure including a provision of a structure including an exposed layer, a deposition of a layer based on a material of formula $Si_aY_bX_c$, with X chosen from among fluorine F and chlorine Cl, and Y chosen from among oxygen O and nitrogen N, a, b and c being non-zero positive integers, a treatment of the layer $Si_aY_bX_c$ by an activation plasma based on at least one from among oxygen and nitrogen, the parameters of the deposition of the layer $Si_aY_bX_c$ being chosen so as to obtain a sufficiently low material density such that the layer $Si_aY_bX_c$ is at least partially consumed by the activation plasma.

20 Claims, 6 Drawing Sheets (58) Field of Classification Search
CPC ........... H01L 21/02131; H01L 21/0217; H01L 21/02263; H01L 21/2007; H01L 21/185; H01L 21/187; H01L 24/27; H01L 2224/271; H01L 2224/83009
See application file for complete search history.

(56) References Cited

U.S. PATENT DOCUMENTS

| | | |
|---|---|---|
| 2006/0216904 A1 | 9/2006 | Tong |
| 2008/0187757 A1 | 8/2008 | Tong |
| 2011/0017705 A1* | 1/2011 | Jalabert ............. H01L 21/31138 216/41 |
| 2011/0143150 A1 | 6/2011 | Tong |
| 2012/0183808 A1 | 7/2012 | Tong |
| 2014/0174649 A1 | 6/2014 | Agraffeil |
| 2015/0064498 A1* | 3/2015 | Tong ........................ B32B 7/04 428/688 |
| 2019/0333764 A1* | 10/2019 | Chan ................. H01L 21/02115 |
| 2019/0344533 A1 | 11/2019 | Tong |
| 2019/0344534 A1 | 11/2019 | Tong |

OTHER PUBLICATIONS

Plößl et al., "Wafer direct bonding: tailoring adhesion between brittle materials", Materials Science and Engineering: R: Reports, vol. 25, No. 1-2, 1999, 88 pages.

Reiche et al., "Modification of Si (100)—Surfaces by SF6 Plasma Etching-Application to Wafer Direct Bonding", Crystal Research and Technology: Journal of Experimental and Industrial Crystallography, vol. 35, No. 6-7, 2000, 15 pages.

Wang et al., "Investigation of fluorine containing plasma activation for room-temperature bonding of Si-based materials", Microelectronics Reliability, vol. 52, No. 2, 2012, 5 pages.

* cited by examiner

METHOD FOR ACTIVATING AN EXPOSED LAYER

TECHNICAL FIELD

The present invention relates to the field of methods for activating a surface of a structure such as a substrate. Generally, the field of microelectronic devices is targeted. It has a particularly advantageous application in the field of the direct bonding of substrates.

STATE OF THE ART

It is generally known to assemble several substrates by direct bonding for microelectronic device manufacture. For this, there are solutions implementing an activation plasma making it possible to improve the bonding energy between the assembled substrates. In these solutions, the exposed layer of a substrate is typically treated by an oxygen- or nitrogen-based activation plasma, prior to assembly. In practice, the bonding energy obtained remains too limited.

The injection of a fluorinated gas, such as carbon tetrafluoride of chemical formula $CF_4$ or sulphur hexafluoride of chemical formula $SF_6$ in an oxygen-based activation plasma makes it possible to increase the bonding energy between two assembled substrates following this treatment. This solution has proved to be limited in practice, in particular due to an etching of the exposed layer during the treatment by the activation plasma.

A method comprising the formation of an SiOF bonding layer on the exposed layer of a substrate by plasma-enhanced chemical vapour deposition (PECVD), prior to the assembly of the substrate with another substrate is, in particular, known from document U.S. Pat. No. 10,434,749 B2. This solution however remains improvable.

An aim of the present invention is therefore to propose a solution aiming to improve the direct bonding on a substrate, and in particular aiming to limit the etching of the exposed layer.

Other aims, features and advantages of the present invention will appear upon examining the following description and the accompanying drawings. It is understood that other advantages can be incorporated.

SUMMARY

To achieve this aim, according to an embodiment, a method for activating an exposed layer of a structure is provided, comprising:
  a provision of a structure comprising an exposed layer,
  a deposition, on the exposed layer, of a layer based on a material of formula $Si_aY_bX_c$, called layer $Si_aY_bX_c$, with X chosen from among fluorine F and chlorine Cl, and Y chosen from among oxygen O and nitrogen N, a, b and c being non-zero positive integers,
  a treatment of the layer $Si_aY_bX_c$ by an activation plasma based on at least one from among oxygen and nitrogen, and wherein the parameters of the deposition of the layer $Si_aY_bX_c$ are chosen so as to obtain a sufficiently low material density, such that the layer $Si_aY_bX_c$ is at least partially consumed by the activation plasma.

This method thus makes it possible to temporally separate the formation of a fluorinated and/or chlorinated layer and the activation by the activation plasma. The consumption of the exposed layer is therefore limited with respect to the solutions implementing an input of fluorinated gas in the activation plasma.

The lower density of the layer $Si_aY_bX_c$ means that it is possible to remove this layer at least partially by the activation plasma to activate the exposed surface of a substrate before bonding. The thickness of the deposited layer $Si_aY_bX_c$ is thus reduced by the treatment by the activation plasma. Preferably, the layer $Si_aY_bX_c$ is fully consumed, prior to an assembly of the structure with another substrate, while making it possible to chemically modify the surface of the exposed layer for its activation.

The at least partial, and preferably total removal of this layer makes it possible to avoid modifications of the properties of the assembly after bonding, for its integration in a microelectronic device. The F or Cl, and O or N species, can only be implanted on the surface of the exposed layer.

Typically, the layers deposited in the deposition reactor, for example by PECVD, have a density which is too high to be able to be consumed by the activation plasma. For remove a deposited layer $Si_aY_bX_c$ in the deposition reactor, a person skilled in the art would have considered removing the layer $Si_aY_bX_c$ usually by hydrofluoric acid etching. However, in the scope of development of the present invention, it has proved to be that this etching is too aggressive and risks etching the exposed layer and removing the fluorine/chlorine on the surface of the exposed layer, enabling its activation. The subsequent bonding would therefore be deteriorated.

A second aspect relates to a method for bonding an exposed layer of a structure with an exposed layer of a distinct substrate, the method comprising:
  the activation of the exposed layer of the structure by implementing the method according to the first embodiment,
  the contact of the exposed layer of the structure with the exposed layer of the distinct substrate.

Preferably, the exposed layer of the structure with the exposed layer of the distinct substrate are assembled by direct bonding. This method has the effects and advantages of the method according to the first aspect. The bonding method makes it possible to obtain an assembly having a bonding interface, between the exposed layer of the structure and the exposed layer of the distinct substrate, improved with respect to the existing solutions.

BRIEF DESCRIPTION OF THE FIGURES

The aims, objectives, as well as the features and advantages of the invention will emerge best from the detailed description of an embodiment of the latter, which is illustrated by the following accompanying drawings, wherein.

The drawings are given as examples and are not limiting of the invention. They constitute principle schematic representations intended to facilitate the understanding of the invention and are not necessarily to the scale of practical applications. In particular, the thicknesses of the different layers are not representative of reality.

DETAILED DESCRIPTION

Before starting a detailed review of embodiments of the invention, optional features are stated below which can optionally be used in association or alternatively.

According to an example, the parameters chosen so as to obtain a sufficiently low material density, such that the layer $Si_aY_bX_c$ is at least partially consumed by the activation plasma taken from among the following parameters: the deposition temperature, the pressure in the reaction chamber and, the deposition being plasma-enhanced, the power of a plasma source.

According to an example, the parameters of the treatment of the layer $Si_aY_bX_c$ by the activation plasma are chosen to consume at least partially the deposited layer $Si_aY_bX_c$ so as to activate the exposed layer of the structure.

According to an example, the parameters of the treatment of the layer $Si_aY_bX_c$ by the activation plasma are chosen to consume at least 90% of the deposited layer $Si_aY_bX_c$ and preferably the whole deposited layer $Si_aY_bX_c$. Thus, the treatment by the activation plasma makes it possible to remove the deposited layer $Si_aY_bX_c$ which could impact the properties of the resulting microelectronic device.

According to an example, the deposition is configured such that the layer $Si_aY_bX_c$ has a thickness less than or equal to 10 nm, a greater thickness hardly having any impact on the bonding energy. A thickness less than or equal to 10 nm therefore makes it possible to limit the time and the cost of the method.

According to an example, the deposition is configured such that the layer $Si_aY_bX_c$ has a thickness greater than or equal to 2 nm. This thickness is sufficient to cover the exposed layer and have enough $Si_aY_bX_c$ to activate the exposed layer and increase the bonding energy.

According to an example, the deposition is configured such that the layer $Si_aY_bX_c$ has a thickness, preferably between 2 and 4 nm. This thickness range is a good compromise between cost and time of the method and the bonding energy obtained.

According to an example, the deposition of the layer $Si_aY_bX_c$ and the treatment by the activation plasma are performed in the same reaction chamber. This makes it possible to simplify the method, to make it cheaper and more easily reproducible.

According to an example, the substrate is left in the reaction chamber between the deposition of the layer based on a material of chemical formula $Si_aY_bX_c$ and the treatment by the activation plasma.

According to an example, the treatment by the activation plasma comprises the application of a voltage in the reaction chamber, called self-polarisation voltage, preferably the self-polarisation voltage is non-zero. Thus, the energy of the ions of the activation plasma can be modulated to improve the effectiveness of the ion bombardment on the layer $Si_aY_bX_c$ and therefore the activation of the exposed layer, while limiting the etching of the exposed layer.

According to an example, the absolute value of the self-polarisation voltage is substantially greater than or equal to 100V, preferably substantially greater than or equal to 200V. According to an example, the absolute value of the self-polarisation voltage is substantially less than or equal to 500V. According to an example, the absolute value of the self-polarisation voltage is substantially between 100V and 500V, preferably substantially equal to 450V.

According to an example, the deposition of the layer $Si_aY_bX_c$ comprises the application in the reaction chamber of a voltage, called self-polarisation voltage, less than or equal to 100V, preferably between 0V and 50V, preferably no self-polarisation voltage is applied during said deposition. The ion bombardment is thus limited during the deposition of the layer $Si_aY_bX_c$, which limits the risk of etching of the exposed layer.

According to an example, the deposition of the layer $Si_aY_bX_c$ and the treatment by the activation plasma are performed in the same reaction chamber.

According to an example, the structure is provided in a reactor comprising a reaction chamber inside which the structure is disposed for at least the deposition of the layer $Si_aY_bX_c$, the temperature in the chamber being less than or equal to 100° C. at least during the deposition of the layer $Si_aY_bX_c$, and preferably substantially between 20° C. and 80° C.

According to an example, the structure is provided in a reactive etching reactor, the reactor comprising a reaction chamber inside which the structure is disposed for at least the deposition of the layer $Si_aY_bX_c$, and preferably for the deposition of the layer $Si_aY_bX_c$ and the activation plasma.

According to an example, the deposition of the layer $Si_aY_bX_c$, and the treatment by the activation plasma is performed in a reaction chamber of a capacitively coupled plasma reactor.

According to an example, the deposition of the layer $Si_aY_bX_c$, and the treatment by the activation plasma is performed in a reaction chamber of an inductively coupled plasma reactor.

According to an example, the deposition of the layer $Si_aY_bX_c$ is not performed by a CVD technique. According to an example, the deposition of the layer $Si_aY_bX_c$ is performed by a technique different from a CVD deposition, and in particular, from a PECVD deposition. More specifically, the deposition is performed in a reactive ion (RI) etching chamber, preferably inductively coupled, different from CVD and PECVD techniques.

According to an example, the layer $Si_aY_bX_c$ is made of a material not comprising carbon. According to an example, the layer $Si_aY_bX_c$ is made of a material of formula $Si_aY_bX_c$. The material $Si_aY_bX_c$ has less of an impact on the performance of the device with respect to other species like carbon.

According to an example, during the treatment by the activation plasma, a polarisation voltage $V_{bias\text{-}substrat}$ is applied to the structure. Thus, the ion bombardment on the layer $Si_aY_bX_c$ and the etching of the exposed layer can be even better controlled and preferably minimised. According to an example, the polarisation voltage $V_{bias-substrat}$ is non-zero. According to an example, the voltage applied to the structure $V_{bias-substrat}$ is chosen such that the absolute value of the self-polarisation voltage is between 100V and 500V.

According to an example, the polarisation voltage $V_{bias-substrat}$ applied to the structure is pulsed. This enables a larger parameter window to minimise the etching of the exposed layer, while enabling its activation.

According to an example, the polarisation voltage $V_{bias-substrat}$ applied to the structure and the plasma source are pulsed.

According to an example, a polarisation voltage $V_{bias-substrat}$ is applied to the structure independently to the radiofrequency (RF) power of the plasma source $P_{s-plasma}$.

According to an example, the deposition of the layer based on a material of formula $Si_aY_bX_c$ is a chemical deposition from at least one gaseous precursor. Preferably, the deposition is plasma-enhanced. A plasma-enhanced deposition enables a better compliance and/or uniformity of the layer $Si_aY_bX_c$.

According to an example, the at least one gaseous precursor comprises at least the silicon elements, one from among fluorine and chlorine, and one from among oxygen and nitrogen. Preferably, the at least one gaseous precursor being chosen from among the group constituted of $SiF_4$ and $SiCl_4$ combined with $O_2$ or $N_2$.

According to an example, during the deposition of the layer based on a material of chemical formula $Si_aY_bX_c$, the exposed layer is not etched.

According to an example, the activation plasma is nitrogen- and/or oxygen-based.

According to an example, the treatment by the activation plasma comprises an injection of at least one gas in a reaction chamber of a plasma reactor and a formation of the activation plasma from said gas in the reaction chamber. According to an example, the at least one gas comprises dioxygen, dinitrogen, or their mixture. According to an example, the at least one gas comprises dioxygen and/or dinitrogen, mixed with a neutral gas such as helium and/or argon.

According to an example, the activation plasma has no halogenated species and in particular, no fluorine and chlorine. The activation plasma cannot comprise any injection of a gas comprising halogen element and in particular, the fluorine or chlorine element in the reaction chamber. The etching of the exposed layer is therefore minimised, even avoided. Thus, this method is clearly differentiated from known solutions consisting of performing a treatment by an activation plasma with the injection of a gas comprising the fluorine or chlorine element.

According to an example, the activation plasma is configured to not deposit any layer on the exposed layer and/or the walls of the reaction chamber.

According to an example, the exposed layer is based on a semiconductor or a metal or a metalloid. For example, the exposed layer is based on or made of a metal oxide, for example a semiconductor oxide, a metal nitride, for example a semiconductor nitride.

According to an example, the exposed layer is silicon-based. For example, the exposed layer is based on or made of a silicon oxide, a silicon nitride or silicon.

According to an example, after the treatment by the activation plasma, the method can comprise the assembly of the exposed layer of the structure with an exposed layer of a distinct substrate.

According to an example, at least one from among the deposition of the layer based on a material of formula $Si_aY_bX_c$ and the treatment by the activation plasma can be repeated several times. According to an example, at least one from among the activation of the deposition and the treatment by the activation plasma can be repeated several times before the assembly of the exposed layer of the structure with an exposed layer of a distinct substrate. Preferably, the deposition of the layer based on a material of formula $Si_aY_bX_c$ and the treatment by the activation plasma form a cycle which could be repeated several times.

By microelectronic device, this means any type of device produced with microelectronic means. These devices comprise, in particular, in addition to devices with a purely electronic purpose, micromechanical or electromechanical devices (MEMS (microelectromechanical systems) NEMS (nanoelectromechanical systems), etc.), as well as optical or optoelectronic devices (MOEMS (micro-opto-electro-mechanical systems), etc.).

This can be a device intended to ensure an electronic, optical, mechanical function, etc. It can also be an intermediary product, only intended to produce another microelectronic device.

By "direct bonding", this means a bonding without input of adhesive material (of glue or polymer type, in particular) which consists of the contact of relatively smooth surfaces (of a roughness typically less than 5 Å, $10^{-9}$ m), for example produced at ambient temperature and in an ambient atmosphere, in order to create an adherence between them.

According to an example, the direct bonding of two substrates means that the bonding is obtained by chemical bonds which are established between the two surfaces put in contact.

Direct bonding can be obtained without requiring the application of a significant pressure on the structure to be assembled. A slight pressure can simply be applied to initiate the bonding. A thermal annealing can further be performed to consolidate the bonding.

By a substrate, a layer, a zone or a portion "based on" material A, this means a substrate, a layer, a zone or a portion comprising this material A, for example at a rate of at least 50%, and optionally other materials, for example doping elements.

Fully conventionally, a structure based on a metal oxide is a structure made, or comprising, of a material comprising at least one metal or one metalloid and oxygen. A structure based on a metal nitride is a structure made, or comprising, of a material comprising at least one metal or one metalloid and nitrogen.

The word "dielectric" qualifies a material of which the electric conductivity is sufficiently low in the given application to serve as an insulator. In the present invention, a dielectric material preferably has a dielectric constant greater than 4.

It is specified that in the scope of the present invention, the term "on", "surmounts", or their equivalents do not necessarily mean "in contact with", except for contrary mention of "juxtaposed". By "juxtaposed" layers, or portions, or zones, this means, in this case, that the layers, or portions, or zones are in contact along their main extension plane and disposed on top of one another in the direction of the stack, this direction being perpendicular to the main extension plane. By "in contact", this means that a thin interface can exist, for example caused by the manufacturing variability.

In the description below, the layer, zone or portion thicknesses, as well as the depths are generally measured in a vertical direction, parallel to the stack direction and perpendicular to the main extension plane of the substrate, of the layer, of the sublayer or of the portion.

Moreover, a nitrogen- and/or oxygen-based plasma can be based on a chemistry comprising only nitrogen and/or oxygen or comprising nitrogen and/or oxygen and optionally one or more other species, for example neutral gases (such as helium or argon, for example).

In the present patent application, when a gaseous mixture is expressed with percentages, these percentages correspond to fractions of the total flow rate of the gases injected in the reactor. Thus, if a gaseous mixture, for example intended to form a plasma, comprises x % of the gas A, this means that the injection flow rate of the gas A corresponds to x % of the total flow rate of the gases injected in the reactor to form the plasma.

Several embodiments of the invention implementing successive steps of the manufacturing method are described below. Unless explicitly mentioned, the adjective "successive" does not necessarily imply, even if this is generally preferred, that the steps immediately follow one another, intermediate steps which could separate them.

Moreover, the term "step" means the performance of some of the method, and can mean a set of substeps.

Moreover, the term "step" does not compulsorily mean that the actions carried out during a step are simultaneous or immediately successive. Certain actions of a first step can in particular be followed by actions linked to a different step, and other actions of the first step can then be resumed. Thus, the term "step" does not necessarily mean single and inseparable actions over time and in the sequence of phases of the method.

By a parameter which is "substantially equal to/greater than/less than" a given value, this means that this parameter is equal to/greater than/less than the given value, at about 10%, even at about 5%, of this value. By a parameter which is "substantially between", this means two given values that this parameter is, as a minimum, equal to the lowest given value, at about 10% of this value, and as a maximum, equal to the highest given value, at about 10% of this value.

The activation method is now described in a non-limiting manner according to several examples of embodiments.

Figure 1:
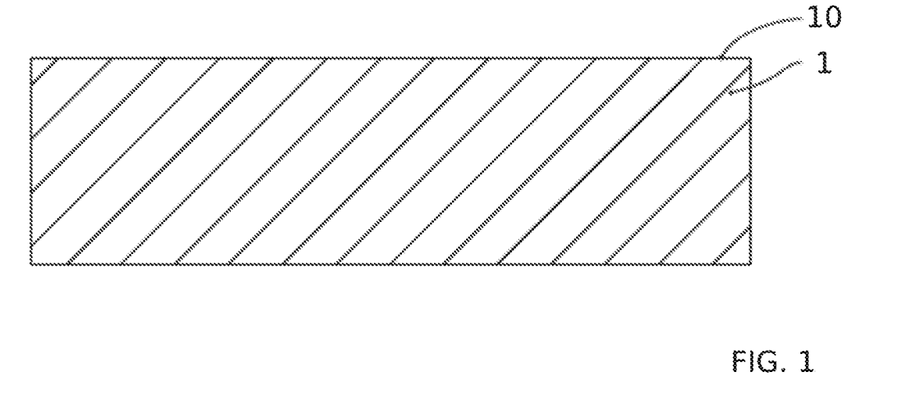
FIG. 1 represents a transverse cross-sectional view of a structure having an exposed layer, according to an example of an embodiment.

The method is configured to activate the exposed layer 10 of a structure 1, for example illustrated by FIG. 1. Such a structure is, for example, based on a semi-conductor material. In the non-limiting example which will be described in detail, this structure 1 is based on or made of silicon. This structure 1 can be based on or made of a silicon oxide, a silicon nitride or silicon. The structure 1 can be so-called "bulk" solid silicon. Moreover, all the features, steps and technical effects which will be described below are fully applicable to a structure 1, possibly other than a layer, such as a nanostructure, for example three-dimensional, or a plurality of such structures.

The structure 1 can form part of a substrate. This substrate can be formed only of this structure 1. Alternatively, this substrate can comprise a support layer surmounted at least with one such structure 1. The structure has an exposed layer 10, free and exposed to the surrounding species, for example present in the reaction chamber 20 of a reactor 2.

To activate the exposed layer 10, the method mainly comprises three steps: a step of providing the structure 1, a deposition step and a treatment step.

The method comprises the deposition of a fluorinated and/or chlorinated layer 11 based on material of chemical formula $Si_aY_bX_c$. X is chosen from among fluorine F and/or chlorine Cl elements. Y is chosen from among oxygen O and/or nitrogen N elements. a, b, c are non-zero positive integers. The fluorinated layer 11 can, for example, have the following chemical formulas: $Si_aO_bCl_c$, $Si_aO_bF_c$, $Si_aN_bCl_c$, and $Si_aN_bF_c$. The method comprises, following this deposition, the treatment of the fluorinated and/or chlorinated layer 11 by an activation plasma 3 configured to consume at least partially, preferably totally, this layer 11 and thus activate the exposed layer 10. Below, the layer 11 based on a material of formula $Si_aY_bX_c$ is referenced layer $Si_aY_bX_c$ 11 or also layer 11. It is understood that the activation plasma is a step, temporally distinct from the deposition step of the layer $Si_aY_bX_c$ 11, these two steps are not simultaneous.

The method is configured to deposit the layer $Si_aY_bX_c$ 11 on the exposed layer such that, during the successive treatment by the oxygen- and/or nitrogen-based activation plasma 3, the activation plasma 3 consumes at least partially the layer $Si_aY_bX_c$ 11. The reactions arising during the consumption of the layer $Si_aY_bX_c$ 11 induce an activation of the exposed layer 10, for example illustrated in FIG. 4 wherein the stars symbolise the activation of the exposed layer 10. The exposed layer 10, once activated, has in particular, on the surface, bonds with fluorine or chlorine atoms according to which the layer $Si_aY_bX_c$ comprises fluorine or chlorine. These surface bonds make it possible to increase the bonding energy during an assembly of the structure with another substrate.

Such that the layer $Si_aY_bX_c$ 11 is at least partially consumed during the treatment by the activation plasma 3, the layer $Si_aY_bX_c$ 11 has a sufficiently low material density. The parameters of the deposition of the layer $Si_aY_bX_c$ 11 are more specifically chosen so as to obtain a sufficiently low material density, such that the layer $Si_aY_bX_c$ is at least partially consumed by the activation plasma, with or without the application of a polarisation voltage $V_{bias\text{-}substrat}$ to the substrate. The following parameters are particularly suitable for modulating the material density of the deposited layer $Si_aY_bX_c$ 11: the deposition temperature, the pressure in the reaction chamber and, the deposition being plasma-enhanced, the power of the RF plasma source. A person skilled in the art knows how to choose these parameters to reach the material density enabling the consumption of the deposited layer 11 during the treatment by the activation plasma. For example, the deposition temperature of the layer $Si_aY_bX_c$ 11 can be substantially less than or equal to 100° C., and preferably substantially between 20° C. and 80° C. The power of the RF plasma source can be substantially less than or equal to 300 W. For example, for this, the pressure in the reaction chamber can be substantially less than or equal to 100 mTorr.

Figure 5:
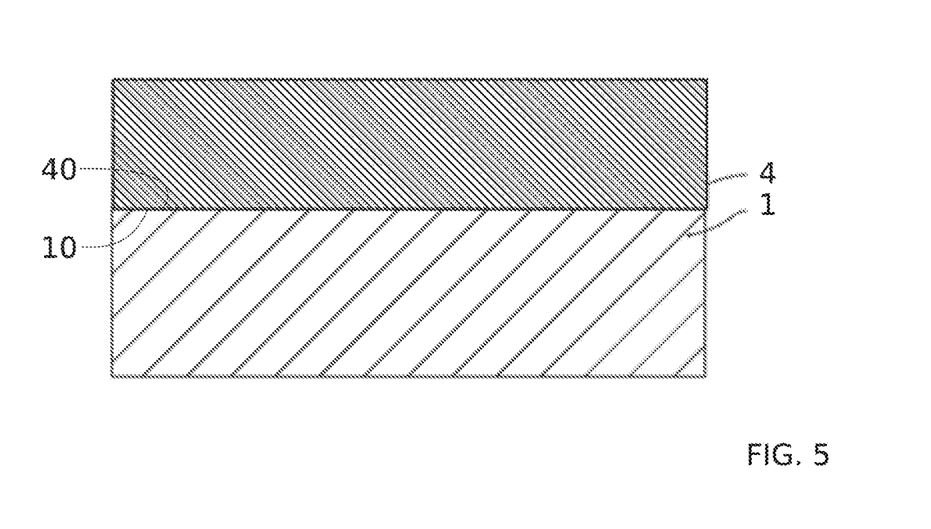
FIG. 5 represents a cross-sectional view of an assembly of the structure having an activated exposed layer according to the example illustrated in FIG. 4, with the exposed layer of a distinct substrate.

Following the activation of the exposed layer 10, the method can further comprise a step of assembling the structure 1 with a distinct substrate or structure. The exposed layer 10 can be assembled by direct bonding to the exposed layer 40 of the substrate 4 or of the structure 4, as for example illustrated by FIG. 5. The structure 4 can form part of a substrate. This substrate can be formed only of this structure 4. Alternatively, this substrate can comprise a support layer surmounted at least by one such structure 4.

Figure 2:
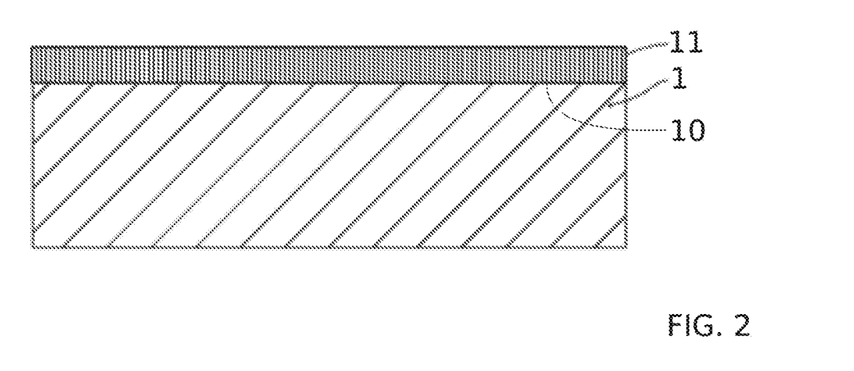
FIG. 2 represents a transverse cross-sectional view of the structure having the exposed layer illustrated in FIG. 1 and the layer based on the material of chemical formula $Si_aY_bX_c$, according to an example of an embodiment.
Figure 3:
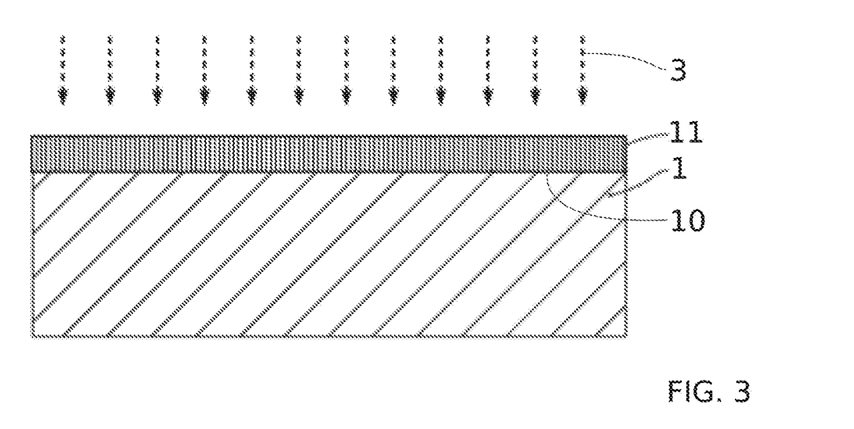
FIG. 3 represents a transverse cross-sectional view of an example of treatment by the activation plasma of the structure according to the example of an embodiment illustrated in FIG. 2.
Figure 4:
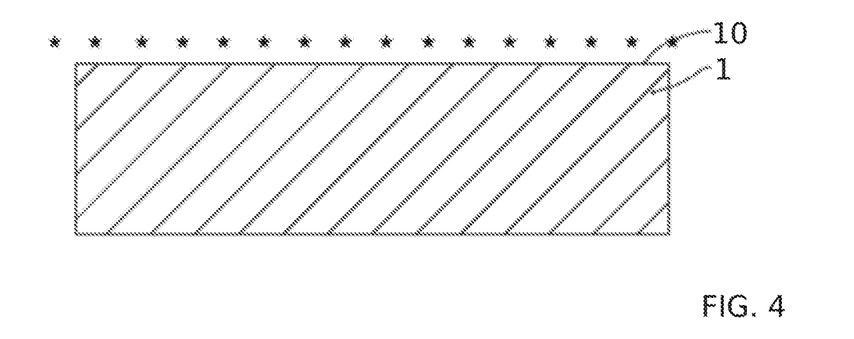
FIG. 4 represents a cross-sectional view of the structure having an activated exposed layer, following the example illustrated by FIG. 3.

An example of an embodiment of the method is described relative to FIGS. 2 to 4.

The structure 1 can be provided inside the reaction chamber 20 of a reactor 2, for example a plasma reactor and in particular a RIE reactor, described in more detail below in reference to FIG. 6.

The structure 1 being placed in the reaction chamber 20, the method can comprise the deposition of the layer $Si_aY_bX_c$ 11, as for example illustrated by FIG. 2. The layer $Si_aY_bX_c$ 11 is thus deposited on, and preferably directly in contact with, the exposed layer 10.

The method then comprises the treatment of the layer $Si_aY_bX_c$ 11 by the oxygen- and/or nitrogen-based activation plasma 3, as for example illustrated by FIG. 3. The layer $Si_aY_bX_c$ 11 on the exposed layer 10 is thus at least partially consumed. The activation plasma reacts with the material $Si_aY_bX_c$. During this reaction, the fluorine or chlorine contained in the layer $Si_aY_bX_c$ 11 reacts with the exposed layer 10 to modify its surface chemical bonds, which induces its activation.

Preferably, the treatment by the activation plasma 3 is performed so as to consume at least 90% of the layer $Si_aY_bX_c$ 11. Preferably, the layer $Si_aY_bX_c$ 11 is totally consumed. Thus, the material $Si_aY_bX_c$ 11 no longer remains during a subsequent assembly with the exposed layer 40 of another substrate 4, for example illustrated by FIG. 5. The bonding and/or the properties of the resulting microelectronic device are thus also improved. The quality of the interface between the exposed layer 10 and the exposed layer 40 after assembly is improved. For this, the parameters of the plasma can, for example, be adjusted, such as the flow rate of injected precursor(s), the power of the source, the pressure in the reaction chamber 20, the self-polarisation voltage and in particular, a polarisation voltage applied to the substrate, the temperature of the substrate.

The properties of the exposed layer 10 after treatment by the activation plasma 3 can be analysed by a characterisation of the exposed layer 10, for example by X-ray photoelectron spectrometry (XPS). The exposed layer 10 once activated has, in particular, on the surface with fluorine or chlorine atoms according to which the layer $Si_aY_bX_c$ comprises fluorine or chlorine. As an example, after treatment by an $O_2$-based activation plasma 3, the silicon-based exposed layer 10, on which a deposition with the $SiF_4$ precursor combined with $O_2$ has been deposited beforehand, can have an $Si_aO_bF_c$-type surface in the case of a silicon-on-insulator (SOI) substrate. According to another example, after treatment by an $N_2$-based activation plasma 3, the silicon-based exposed layer 10 on which a deposition with the $SiF_4$ precursor combined with $O_2$ has been deposited beforehand, can have a $Si_aO_dF_cN_b$-type surface in the case of a silicon-on-insulator substrate, with d being a non-zero positive integer. According to this example, the deposition of the layer $Si_aY_bX_c$ 11 and the treatment by the activation plasma 3 can be done in the same reaction chamber 20. Preferably, the substrate is left in the reaction chamber 20 between the deposition of the layer $Si_aY_bX_c$ 11 and the treatment by the activation plasma 3. The present of impurity on the layer $Si_aY_bX_c$ 11 and in the exposed layer 10 is thus better controlled, and preferably avoided.

The etching of the exposed layer 10 is limited, and preferably avoided, while applying a fluorine or chlorine source on the exposed layer 10, for the activation of the exposed layer during the treatment by the activation plasma 3.

At least one from among the deposition of the layer $Si_aY_bX_c$ 11 and the treatment by the activation plasma 3 can be repeated several times. Several arrangements of steps can, for example, be provided. For example, it can be provided that, following the provision of the structure in the reaction chamber 20, the deposition of the layer $Si_aY_bX_c$ 11 then the treatment by the activation plasma are repeated several times.

The deposition of the layer $Si_aY_bX_c$ 11 is now described in more detail. According to an example, the deposition of the layer $Si_aY_bX_c$ 11 is a chemical deposition from at least one gaseous precursor. The at least one gaseous precursor can comprise silicon, chlorine or fluorine, and oxygen or nitrogen elements. According to an example, at least one precursor can comprise silicon and chlorine or fluorine elements, and at least one distinct precursor can comprise the nitrogen and/or oxygen element. For example, a gaseous precursor is chosen from among $SiF_4$ and $SiCl_4$. Another precursor can be chosen from among $O_2$ and $N_2$. Preferably, the quantity of precursor comprising silicon and chlorine or fluorine elements, for example the flow rate, with respect to the quantity of the other precursor(s) comprising the nitrogen and/or oxygen element is substantially between 0.5 and 3. For example, the $SiF_4/O_2$ ratio is substantially between 0.5 and 3. This makes it possible to improve the control of the deposition, and in particular, to control the thickness and the material density of the layer $Si_aY_bX_c$ 11.

The deposition of the layer $Si_aY_bX_c$ 11 can comprise an injection of the gaseous precursor(s), optionally mixed with other precursors and/or one or more neutral gases, such as helium or argon.

According to an example, during the deposition, the flow rate of precursor(s) injected is substantially between 5 and 500 sccm (standard cubic centimetres per minute, and commonly used in the field for measuring the flow rate of a gas). According to an example, the flow rate of precursor(s) injected comprising silicon and chlorine or fluorine elements is substantially less than or equal to 500 sccm, preferably substantially less than or equal to 200 sccm, and/or substantially greater than or equal to 70 sccm. Preferably, the flow rate of precursor(s) injected comprising the nitrogen and/or oxygen element is substantially less than or equal to 150 sccm. The pressure can be substantially between 10 mTorr and 100 mTorr (with 1 Torr about equal to 133.322 pascals (Pa) in the International System of Units). The pressure flow rates are in particular chosen in order to control the deposition speed and to obtain a good uniformity of the deposited layer 11.

The temperature in the reaction chamber 20, preferably the temperature of the structure or equivalently of the substrate, during the deposition of the layer 11, can be between substantially 10° C. and 100° C. Preferably, to limit the density of the layer $Si_aY_bX_c$, the temperature in the reaction chamber 20 is substantially less than or equal to 100° C., and preferably substantially between 20° C. and 80° C. The temperature in the reaction chamber can be the temperature of the walls of the chamber 20 and/or the temperature of the sample holder 21.

The power of the plasma source can be between 200 W and 3000 W during the deposition of the layer 11. Preferably, to limit the density of the layer $Si_aY_bX_c$, the power of the plasma source can be substantially less than or equal to 300 W.

As a non-limiting example, during the deposition of the layer 11, an $SiF_4$ precursor is injected at a flow rate substantially equal to 100 sccm, in addition to $O_2$ at a flow rate of 150 sccm, at a pressure of 10 mTorr and an RF power of the plasma $P_{s\text{-}plasma}$ of 300 W. It is noted that these parameters can be adapted according to the desired thickness of the layer $Si_aY_bX_c$.

The deposition of the layer $Si_aY_bX_c$ 11 can be configured such that the layer $Si_aY_bX_c$ 11 has a thickness substantially greater than or equal to 1 nm, preferably to 2 nm. During the development of the invention, it has been highlighted that this thickness enabled a sufficient activation for subsequent bonding. The deposition of the layer $Si_aY_bX_c$ 11 can be configured such that the layer $Si_aY_bX_c$ 11 has a thickness substantially less than or equal to 10 nm, preferably to 4 nm. The time necessary for the deposition of the layer is thus limited, while making it possible to obtain a sufficient activation for subsequent bonding. The deposition of the layer $Si_aY_bX_c$ 11 can be configured such that the layer $Si_aY_bX_c$ 11 has a thickness substantially between 1 nm and 10 nm, and preferably between 2 nm and 4 nm.

The treatment by the activation plasma 3 is now described in more detail. The treatment by the activation plasma 3 can comprise an injection of at least one gas into the reaction chamber 20 and a formation of the activation plasma 3 from the gas. The activation plasma 3 is based on at least one from among oxygen and nitrogen to react with the layer $Si_aY_bX_c$ 11. For example, the at least one injected gas comprises dioxygen and/or dinitrogen. The gas can be injected in a mixture with one or more neutral gases, for example helium or argon. According to an example, the flow rate of injected gas(es) is substantially between 5 and 200 sccm. The pressure in the reaction chamber can be substantially between 5 mTorr and 200 mTorr (with 1 Torr equal to about 133.322 pascals (Pa) in the International System of Units). The temperature in the reaction chamber, preferably the temperature of the substrate, during the activation plasma, can be between substantially 10° C. and 100° C. The power of the plasma source can be between 200 W and 3000 W during the activation plasma.

The treatment by activation plasma 3 can be continuous. According to an alternative example, the treatment by activation plasma can be pulsed. During the formation of the continuous or pulsed plasma, the gases are preferably continuously injected.

During the treatment by the pulsed activation plasma 3, the pulsed plasma can be obtained by making the plasma source and/or the polarisation $V_{bias-substrat}$ applied to the structure function by intermittence, preferably periodically. The application of the plasma on the structure is thus split over time.

According to an example, the self-polarisation voltage $V_{bias-substrat}$ applied to the structure is pulsed, i.e. that the application of the polarisation voltage comprises a succession alternatively of application and reduced application of the polarisation voltage to the structure. According to an example, in alternance, a polarisation voltage $V_{bias-substrat}1$ and a polarisation voltage $V_{bias-substrat}2$ are applied to the structure successively, with $|V_{bias-substrat}2|<|V_{bias-substrat}1|$, and preferably $|V_{bias-substrat}1| \geq 5*|V_{bias-substrat}2|$ and more preferably $|V_{bias-substrat}1| \geq 10*|V_{bias-substrat}2|$. Preferably, successively in alternance, a self-polarisation voltage $V_{bias-substrat}1$ is applied to the structure and no self-polarisation voltage is applied to the structure. When no self-polarisation voltage $V_{bias-substrat}2$ is voluntarily applied to the structure 1, it is noted that a residual polarisation voltage can be applied to the structure, in particular due to the sleeving phenomenon in the plasma. $|V_{bias-substrat}2|$ can thus be substantially equal to 20V, and more specifically substantially equal to 15V. The fact that the plasma treatment 3 is pulsed makes it possible for a larger parameter window to minimise the etching of the exposed layer while enabling its activation.

As said above, the treatment by activation plasma 3 comprises an injection of at least one gas into the reaction chamber 20 and a formation of a plasma from this gas. The treatment can further comprise several cycles, each cycle comprising an alternance of a draining and of the formation of a plasma, and this cycle being repeated several times during the treatment. In this case also, the application of the plasma on the substrate is split over time. This treatment is therefore referenced by the term of cyclical plasma, opposing a treatment where the cleaning is performed by the application of a plasma continuously.

The treatment by activation plasma 3 can comprise at least one and preferably more cycles. Each cycle comprises at least two, and preferably three, main steps. Each cycle can comprise a step, usually qualified as a draining step. The draining has the function of discharging the gaseous species possibly present in the reaction chamber 20, for example, of discharging the reactional subproducts following the plasma treatment. According to an example, in the cycle, the draining is performed before the formation of the plasma. Thus, the composition of the plasma formed is better controlled, to ensure the quality of the plasma obtained. This draining generally consists of injecting a neutral gas such as argon or helium into the reaction chamber 20.

During the formation of the plasma 3, a self-polarisation voltage, preferably non-zero, is applied. The self-polarisation voltage can be applied to the reaction chamber 20. Thus, the energy of the ions of the activation plasma can be modulated to improve the effectiveness of the ion bombardment on the layer $Si_aY_bX_c$ 11 and therefore the activation of the exposed layer, while limiting the etching of the exposed layer 10. For this, the self-polarisation voltage can be strictly less than 0. The absolute value of the self-polarisation voltage can be substantially greater than or equal to 100V, preferably 200V. The absolute value of the self-polarisation voltage can be substantially less than or equal to 500V, and preferably substantially equal to 450V for a better effectiveness of the ion bombardment.

The treatment by the activation plasma 3 can be performed in a reaction chamber 20 of a reactive etching reactor (commonly called Reactive Ion Etching (RIE)), comprising the CCP and ICP reactors detailed below. According to an example, at least the deposition of the layer $Si_aY_bX_c$ 11 is done in an RIE reactor. Preferably, the deposition of the layer $Si_aY_bX_c$ 11 and the treatment by the activation plasma 3 is done in an RIE reactor.

The deposition of the layer $Si_aY_bX_c$ 11, and/or the treatment by the activation plasma 3 can, according to a first example, be performed in a reaction chamber 20 of a capacitively coupled plasma (CCP) reactor 2. In a capacitively coupled plasma reactor, the self-polarisation voltage $V_{bias-substrat}$ cannot be separated from the RF power $P_{s-plasma}$ supplied to create the plasma. In the case of a CCP-type plasma reactor, the self-polarisation voltage is necessarily non-zero. The plasmas thus produced are capable of depositing a layer $Si_aY_bX_c$ 11 during the deposition step, and producing the activation plasma 3.

The deposition of the layer $Si_aY_bX_c$ 11, and/or the treatment by the activation plasma 3 can, according to a first example, be done in a reaction chamber 20 of an inductively coupled plasma (ICP) reactor 2. In an inductively coupled plasma reactor, the self-polarisation voltage is generated by the RF power applied to the level of the sample holder 21. It therefore corresponds to a polarisation voltage applied to the structure or equivalently to the substrate $V_{bias-substrat}$. The RF power applied to the level of the source 25 of the reactor plasma itself determines the ion density of the plasma. $V_{bias-substrat}$ is, in this case, different and independent from $V_{source}$ the voltage of the plasma source. The advantage of an ICP-type plasma reactor is therefore to be able to separate the ion bombardment on the substrate from the density of the plasma. An inductively coupled plasma will be preferred, which makes it possible to independently control the $V_{bias-substrat}$ with respect to the RF power $P_{s-plasma}$ of the source 25 of the plasma for a better control of the self-polarisation voltage, by separation of the voltage applied to the substrate and the RF power of the plasma $P_{s-plasma}$.

Thus, the ion bombardment on the layer $Si_aY_bX_c$ 11 and the etching of the exposed layer 10 can be even better controlled and preferably minimised. Consequently, the subsequent bonding will be improved. Furthermore, the quality of the interface between the exposed layer 10 and the exposed layer 40 after assembly of the structure 1 and of the substrate 4 is improved.

Figure 6:
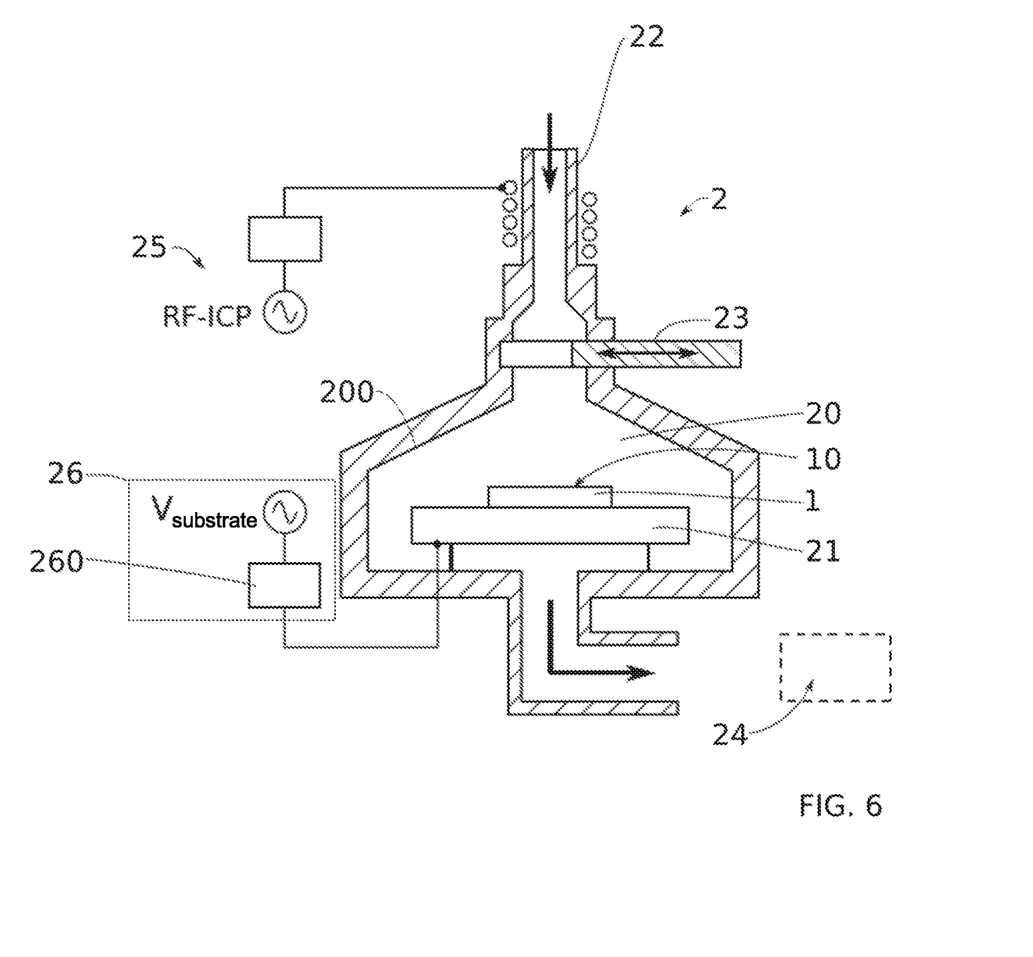
FIG. 6 schematically represents an example of a reactor which could be used to implement the method according to the invention.

In practice, as for example illustrated by FIG. 6, the reaction chamber 20 comprises a receiving tray 21 of the substrate or also sample holder. According to an example, the polarisation voltage $V_{bias-substrat}$ is applied to the tray 21. Preferably, the polarisation voltage $V_{bias-substrat}$ is applied only to the tray 21. According to this example, the tray 21 is electrically conductive and the polarisation voltage $V_{bias-substrat}$ is applied to this tray 21 by a voltage regulation device 26 to be transmitted to the structure 1. The voltage regulation device 26 is, for example, configured to apply an RF power to the level of the sample holder.

According to an example, the absolute value of the applied polarisation voltage $|V_{bias-substrat}|$ is substantially less than or equal to 500V. The absolute value of the applied polarisation voltage $|V_{bias-substrat}|$ can be substantially greater than or equal to 50V. It will be noted that this polarisation voltage is lower than the polarisation voltages usually used to perform implantations by plasma in a CCP reactor. According to an example, the polarisation voltage $V_{bias-substrat}$ is applied only during the treatment by the activation plasma 3. According to an example, the polarisation voltage $V_{bias-substrat}$ is applied only during the formation of the plasma, during the treatment by the activation plasma 3. According to an example, a polarisation voltage $V_{bias-substrat}$ is applied during at least 50% and preferably at least 70% of the formation of the plasma, during the treatment by the activation plasma 3.

According to an example, a polarisation voltage $V_{bias-substrat}$ can be applied to the structure during the deposition of the layer $Si_aY_bX_c$ 11. During the deposition, $V_{bias-substrat}$ is preferably less than or equal to 100V, preferably between 0 and 50V. Even more preferably, no polarisation voltage is applied during the deposition step. The ion bombardment is thus limited, which also limits the risk of etching the exposed layer 10.

An ICP reactor is now described as an example in reference to FIG. 6. Relatively conventionally, the reactor 2 comprises an input 22 of the gases making it possible to inject the gases intended to form the chemistry of the plasma inside the chamber 20, as well as the gases intended for the draining phases. The plasma source 25 is, according to an example, an inductively coupled device 25, a coil of which is illustrated in FIG. 6, and which enables the formation of the plasma. The plasma source 25 can be radiofrequency (RF-ICP in FIG. 6). The reactor 2 also comprises an isolation valve 23 of the reaction chamber 20. The reactor 20 also comprises a pump 24 configured to control the pressure inside the reaction chamber 20 synergically with the flow rate of the injected gases, and to extract the species present in the reaction chamber 20.

Advantageously, this reactor 2 comprises a polarisation device 26 configured to enable the application of the polarisation voltage $V_{bias-substrat}$ to the tray 21, for example via a radiofrequency power generator. This voltage can ultimately be applied to the structure 1, at least at its face rotated facing the tray 21, that this face is electrically conductive or not. This polarisation device 26 is preferably distinct from the plasma source 25. This polarisation device 26 can comprise a control device 260 configured to apply an alternating voltage on the tray 21.

According to this example, the polarisation device 26 and the plasma source 25 are configured so as to be able to adjust the polarisation voltage $V_{bias-substrat}$ applied to the tray 21 independently of the RF power $P_{s-plasma}$ of the source 25 of the plasma. $V_{bias-substrat}$ and $P_{s-plasma}$ can be independent. $V_{bias-substrat}$ and $P_{s-plasma}$ can be controlled independently.

According to an alternative example, during the formation of the activation plasma 3, no voltage $V_{bias-substrat}$ is applied to the substrate.

Particular embodiment examples.

In these examples, the experimental parameters are as follows:
  no polarisation voltage is applied to the structure 1,
  the pressure in the reaction chamber 20 is substantially equal to 10 mTorr,
  the deposition duration is 5 seconds,
  the $SiF_4$ flow rate is substantially equal to 95 sccm,
  the $O_2$ flow rate is substantially equal to 50 sccm, except otherwise indicated,
  the argon flow rate is substantially equal to 475 sccm.

Figure 7:
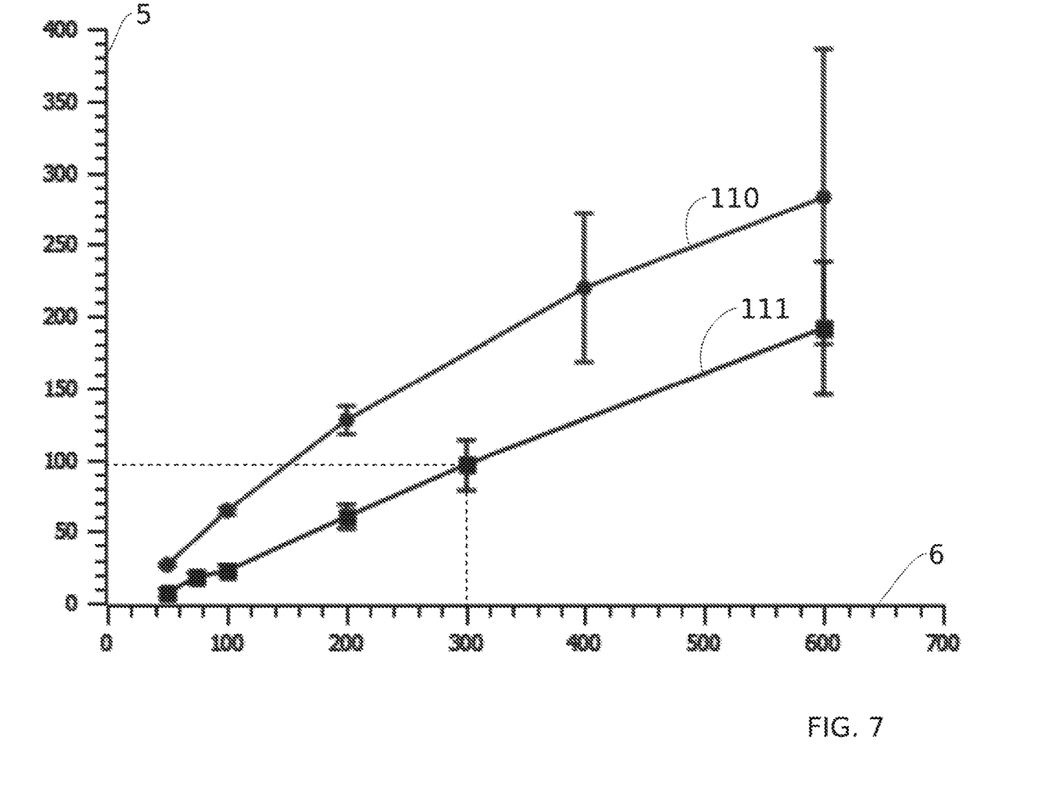
FIG. 7 represents a graph of the thickness of the deposited layer $Si_aY_bX_c$ according to the power of the radiofrequency plasma source, according to several examples of embodiments of the method.
Figure 8:
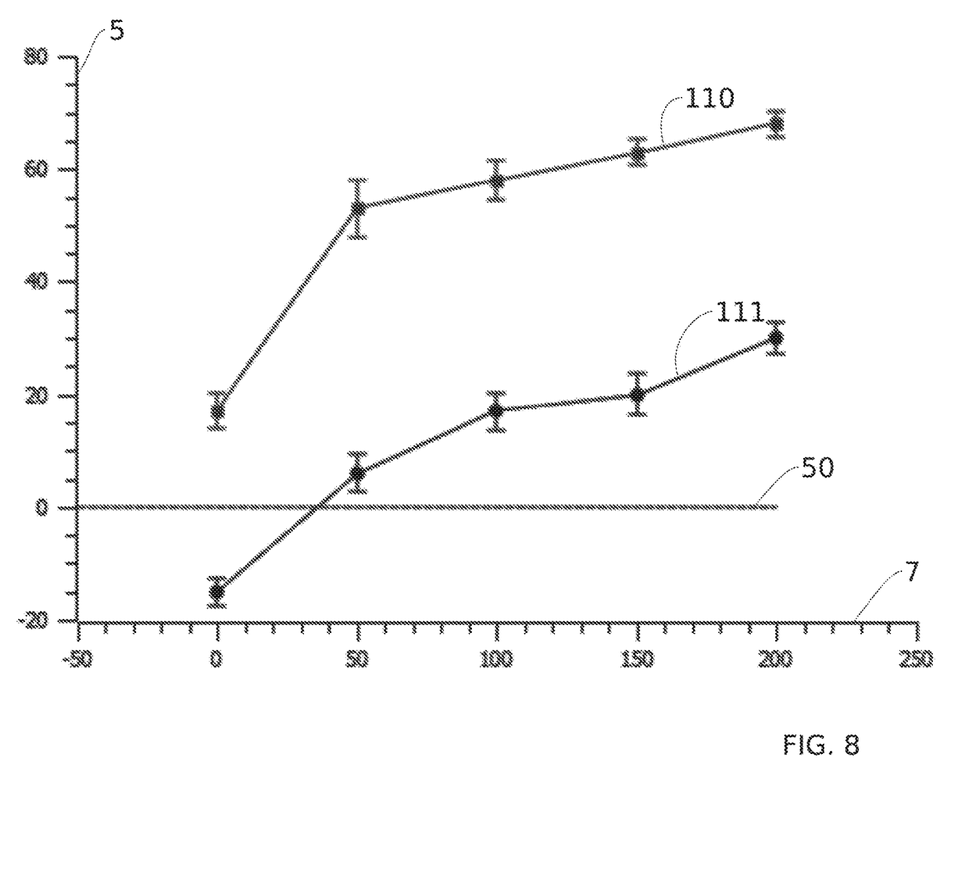
FIG. 8 represents a graph of the thickness of the deposited layer $Si_aY_bX_c$ according to the oxygen flow rate during the deposition, according to several examples of embodiments of the method.
Figure 9:
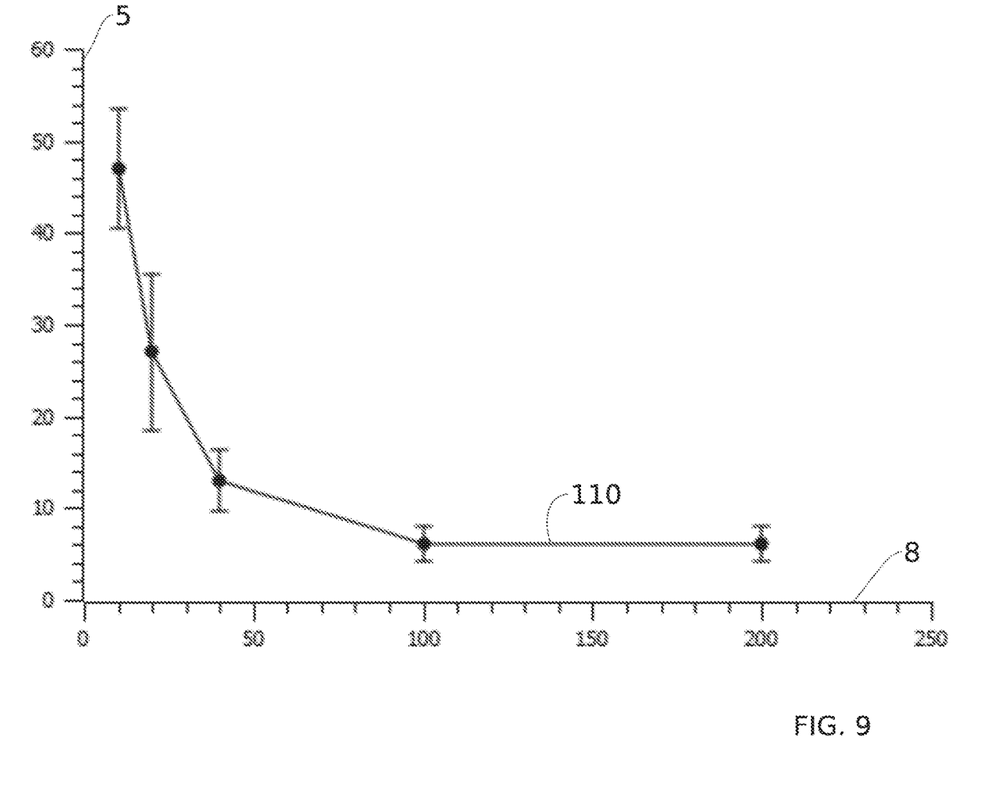
FIG. 9 represents a graph of the thickness of the deposited layer $Si_aY_bX_c$ according to the pressure in the reaction chamber during the deposition, according to an example of an embodiment of the method.

FIGS. 7 to 9 describe the impact of the experimental parameters on the thickness in Å ($10^{-10}$ m) 5 of the layer $Si_aY_bX_c$ 11 for:
  110: a deposition of a layer $Si_aY_bX_c$ 11 on an exposed silica $SiO_2$ layer.
  111: a deposition of the layer $Si_aY_bX_c$ 11 on an exposed resin layer.

FIG. 7 illustrates the impact of the RF power 6 of the source $P_{s-plasma}$. To obtain a thickness less than or equal to 10 nm (100 Å), $P_{s-plasma} \leq 300$ W and preferably $\leq 200$ W preferably $\leq 150$ W.

FIG. 8 illustrates the impact of the $O_2$ flow rate during the deposition step, for an $SiF_4$ flow rate of 95 sccm. A limit 50 between the deposition of the layer $Si_aY_bX_c$ 11 and the etching of the exposed layer 10 is observed. For these parameters, and generally in the invention, the $O_2$ and/or $N_2$ flow rate is chosen so as to deposit the layer $Si_aY_bX_c$ 11 without etching the exposed layer. Preferably, the $O_2$ flow rate is further less than or equal to 150 sccm to limit the thickness of the deposited layer $Si_aY_bX_c$ 11.

FIG. 9 illustrates the impact of the pressure in the reaction chamber 20. The more the pressure increases, the lower the deposited thickness is. Preferably, a pressure substantially between 10 mTorr and 100 mTorr is chosen.

In view of the description above, it clearly seems that the invention proposes a method improving the direct bonding on a substrate and in particular making it possible to limit the etching of the exposed layer.

The invention is not limited to the embodiments described above and extends to all the embodiments covered by the invention. The present invention is not limited to the examples described above. Plenty of other embodiment variants are possible, for example by combining features described above, without moving away from the scope of the invention. Furthermore, the features described relative to an aspect of the invention can be combined with another aspect of the invention.

The invention also extends to embodiments wherein the structure is deposited on a silicon-based substrate.

Moreover, in the examples described above, the structure is a layer. However, all the examples, features, steps and technical advantages mentioned above in reference to a structure forming a layer are applicable to a structure not forming a layer, but forming a punctual structure, for example a three-dimensional raised part. The structure can be a nanostructure or comprise a plurality of nanostructures.

The invention claimed is:

1. A method for activating an exposed layer of a structure, the method comprising:
    providing a structure comprising an exposed layer;
    depositing, on the exposed layer, a layer $Si_aY_bX_c$, which is based on a material of formula $Si_aY_bX_c$, with X chosen from among F and Cl, and Y chosen from among O and N, and a, b and c being non-zero positive integers;
    treating the layer $Si_aY_bX_c$ with an activation plasma based on at least one from among oxygen and nitrogen; and
    at least partially consuming the layer $Si_aY_bX_c$ by the activation plasma,
    wherein the parameters of the deposition of the layer $Si_aY_bX_c$ are chosen so as to obtain a sufficiently low material density such that the layer $Si_aY_bX_c$ is at least partially consumed by the activation plasma.

2. The method according to claim 1, wherein the parameters chosen so as to obtain a sufficiently low material density such that the layer $Si_aY_bX_c$ is at least partially consumed by the activation plasma are taken from among the following parameters: the deposition temperature, the pressure in the reaction chamber, the deposition being plasma-enhanced, and the power of a plasma source.

3. The method according to claim 1, wherein the at least partially consuming the layer $Si_aY_bX_c$ by the activation plasma comprises consuming at least 90% of the deposited layer $Si_aY_bX_c$.

4. The method according to claim 1, wherein the deposition is configured such that the layer $Si_aY_bX_c$ has a thickness less than or equal to 10 nm.

5. The method according to claim 1, wherein the treatment by the activation plasma comprises applying a voltage in a reaction chamber containing the structure,
    wherein an absolute value of the voltage is between 100V and 500V.

6. The method according to claim 1, wherein the deposition of the layer $Si_aY_bX_c$ comprises applying a voltage in a reaction chamber containing the structure, wherein the voltage is less than or equal to 100V.

7. The method according to claim 1, wherein the structure is provided in a reactor comprising a reaction chamber inside which the structure is disposed for at least the deposition of the layer $Si_aY_bX_c$, the temperature in the chamber being less than or equal to 100° C. at least during the deposition of the layer $Si_aY_bX_c$.

8. The method according to claim 1, wherein the structure is provided in a reaction etching reactor, the reaction etching reactor comprising a reaction chamber inside which the structure is disposed for at least the deposition of the layer $Si_aY_bX_c$.

9. The method according to claim 8, wherein the deposition of the layer $Si_aY_bX_c$ and the treatment by the activation plasma are performed in a reaction chamber of a capacitively coupled plasma reactor.

10. The method according to claim 8, wherein the deposition of the layer $Si_aY_bX_c$ and the treatment by the activation plasma are performed in a reaction chamber of an inductively coupled plasma reactor.

11. The method according to claim 10, wherein during the treatment by the activation plasma, a polarisation voltage $V_{bias-substrat}$ is applied to the structure.

12. The method according to claim 1, wherein the activation plasma is pulsed.

13. The method according to claim 1, wherein the deposition of the layer $Si_aY_bX_c$ is a chemical deposition from at least one gaseous precursor, the at least one gaseous precursor comprises at least silicon elements, one from among fluorine and chlorine, and one from among oxygen and nitrogen.

14. The method according to claim 1, wherein the treatment by the activation plasma comprises:
    injecting at least one gas into a reaction chamber of a plasma reactor; and
    forming the activation plasma from said gas in the reaction chamber, the at least one gas comprising dioxygen and dinitrogen.

15. The method according to claim 1, wherein the exposed layer is silicon-based oxide, a silicon nitride or silicon.

16. The method according to claim 1, wherein the deposition of the layer $Si_aY_bX_c$ and/or the treatment by the activation plasma is repeated one or more times.

17. A method for bonding an exposed layer of a structure to an exposed layer of a distinct substrate, the method comprising:
    activating the exposed layer of the structure by the method of claim 1; and
    contacting the exposed layer of the structure with the exposed layer of the distinct substrate.

18. The method according to claim 1, wherein the at least partially consuming the layer $Si_aY_bX_c$ by the activation plasma comprises completely consuming the deposited layer $Si_aY_bX_c$.

19. The method according to claim 1, wherein X is Cl.

20. The method according to claim 1, wherein Y is N.

* * * * *